(12) United States Patent
Morishita

(10) Patent No.: US 12,021,531 B2
(45) Date of Patent: Jun. 25, 2024

(54) SYSTEMS AND TECHNIQUES FOR TIMING MISMATCH REDUCTION

(71) Applicant: Micron Technology, Inc., Boise, ID (US)

(72) Inventor: Yoshihito Morishita, Shibuya-ku (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/895,826

(22) Filed: Aug. 25, 2022

(65) Prior Publication Data

US 2024/0072774 A1 Feb. 29, 2024

(51) Int. Cl.
*H03K 3/0232* (2006.01)
*G01R 31/317* (2006.01)
*H03K 3/014* (2006.01)
*H03K 3/03* (2006.01)

(52) U.S. Cl.
CPC ..... *H03K 3/0232* (2013.01); *G01R 31/31727* (2013.01); *H03K 3/014* (2013.01); *H03K 3/0315* (2013.01)

(58) Field of Classification Search
CPC .... H03K 3/0232; H03K 3/014; H03K 3/0315; G01R 31/31727
USPC ......................................................... 327/227
See application file for complete search history.

(56) References Cited

U.S. PATENT DOCUMENTS

| | | | | |
|---|---|---|---|---|
| 6,339,553 | B1* | 1/2002 | Kuge | H03L 7/0814 365/194 |
| 7,876,138 | B2* | 1/2011 | Kobayashi | H03L 7/0816 327/158 |
| 8,164,372 | B2* | 4/2012 | Mitsubori | G11C 7/1051 365/189.11 |
| 8,531,897 | B2* | 9/2013 | Kim | G11C 7/222 365/194 |
| 2002/0039323 | A1* | 4/2002 | Tokutome | G11C 7/1066 365/233.5 |
| 2008/0094115 | A1* | 4/2008 | Ishikawa | H03L 7/0816 327/158 |
| 2011/0204942 | A1* | 8/2011 | Abe | H03L 7/0814 327/158 |
| 2016/0118094 | A1* | 4/2016 | Hyun | G11C 7/109 365/194 |

* cited by examiner

*Primary Examiner* — Ryan Jager
(74) *Attorney, Agent, or Firm* — Fletcher Yoder, P.C.

(57) ABSTRACT

Systems and techniques to offset conditions affecting propagation delay of a clock signal in a memory device. These include a device that includes a clock adjustment circuit, comprising a differential amplifier, an inverter coupled to a first output of the differential amplifier, and a swing oscillator driver coupled to a second output of the inverter and an input of the differential amplifier. The swing oscillator driver includes a series of transistors, a signal path coupled to at least a first transistor of the series of transistors, wherein the signal path when in operation transmits a signal having a first voltage, and a strength control circuit coupled to the signal path, wherein the strength control circuit when in operation adjusts the first voltage of the signal to a second voltage.

17 Claims, 3 Drawing Sheets

SYSTEMS AND TECHNIQUES FOR TIMING MISMATCH REDUCTION

BACKGROUND

Field of the Present Disclosure

Embodiments of the present disclosure relate generally to the field of semiconductor devices. More specifically, embodiments of the present disclosure relate to mitigation of conditions affecting internal clocks of an electronic device, for example, a memory device.

Description of Related Art

Semiconductor devices (e.g., memory devices) have increasingly been designed to perform a greater number of operations (e.g., refreshing of memory cells, row hammer refresh operations, error checking and/or correcting operations, and the like). The accuracy at which these operations are performed is dependent, at least in part, on a clock of the device. However, variations to conditions affecting the device (e.g., process, voltage, temperature, etc. variations) can cause alterations in clock propagation time across the device. Thus, as devices increase in complexity, differences between an anticipated clock propagation time and actual clock propagation time reduces the operational ability of the device.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As described in detail below, memory devices increasingly utilize clock signals having particular frequencies and timing requirements. Thus, memory devices may include one or more clock adjustment circuits (e.g., clock trees) to adjust aspects of a received clock (e.g., to reduce skew and delay) and to more closely align the clock with timing of received data. In this manner, data received by the memory device can be synchronized (i.e., internal data synchronization for the memory device can be achieved).

However, during manufacture and/or operation of a memory device, a known (i.e. a predetermined) delay (e.g., an expected propagation delay) of a clock introduced by use of the clock adjustment circuit may fluctuate (i.e., drift may be introduced). Causes for this fluctuation may be process, voltage, temperature (PVT), and/or other influences. Accordingly, implementation of a replica circuit that mirrors operation of the clock adjustment circuitry may be utilized to replicate the additional delay introduced by, for example, PVT and/or other influences. This determination can be used to adjust the timing of the clock signal to insure proper synchronization of the clock signal with a data signal. Present embodiments discuss implementations of this replica circuit.

Figure 1:
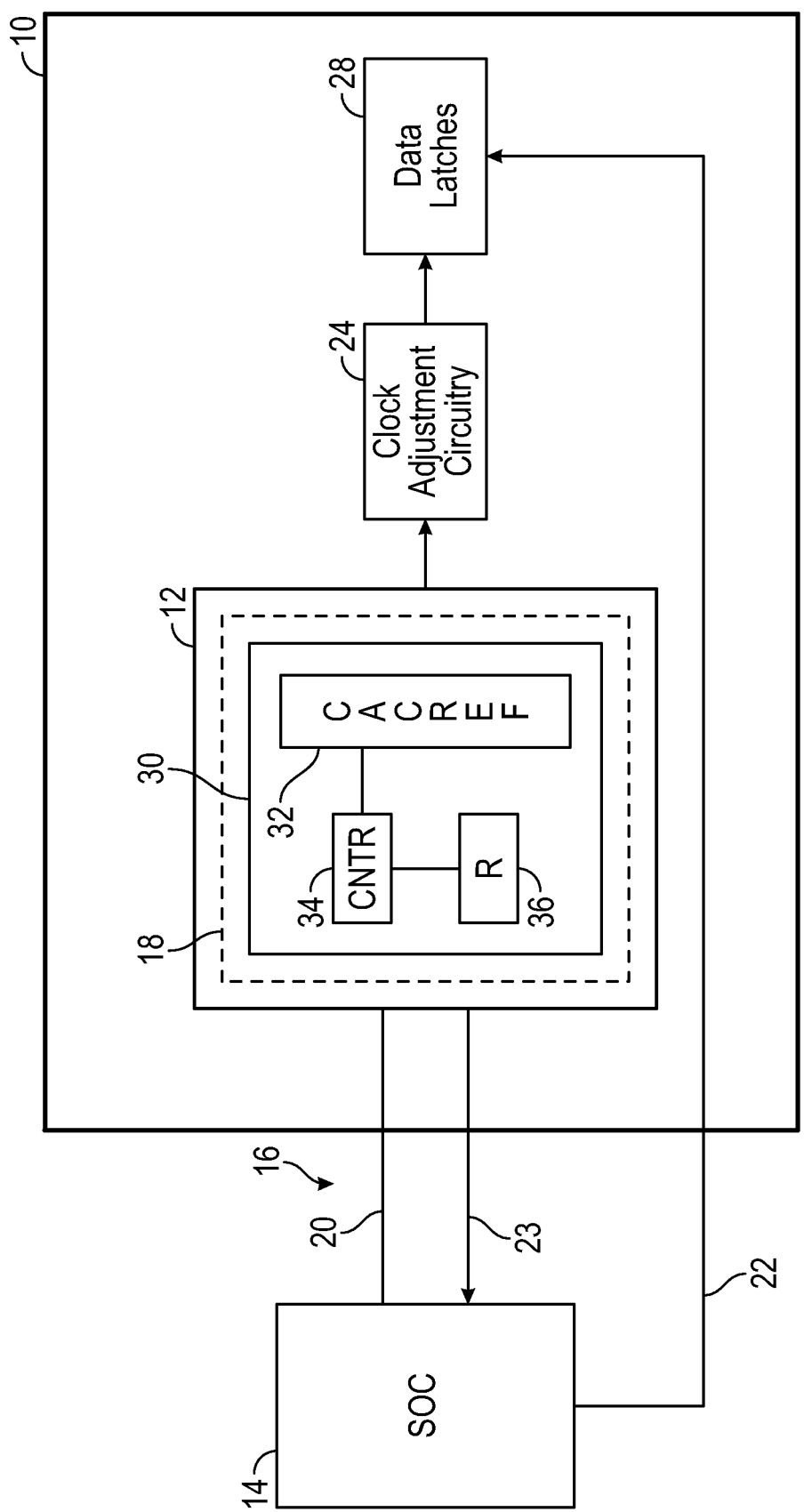
FIG. 1 is a simplified block diagram illustrating certain features of a first embodiment of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a random access memory (RAM) device, a dynamic RAM (DRAM) device, a static RAM (SRAM) device (including a double data rate SRAM device), flash memory, and/or a phase change memory (PCM) device and/or other chalcogenide-based memory, such as self-selecting memories (SSM), a double data rate type four synchronous dynamic random access memory (DDR4 SDRAM) device, a double data rate type five synchronous dynamic random access memory (DDR5 SDRAM) device, a low power double data rate type four synchronous dynamic random access memory (LPDDR4 SDRAM), a low power double data rate type five synchronous dynamic random access memory (LPDDR5 SDRAM) device, or another type device for which determining an actual propagation delay of an internal clock signal to increase synchronization with a received data signal would be beneficial. Memory cells of the memory device 10 can each have a corresponding logic storing device (e.g., a capacitor, a resistor, or the resistance of the chalcogenide material(s)) and can be organized into, for example, a number of memory partitions each inclusive of one or more arrays (i.e., memory arrays). Various configurations, organizations, and sizes of the memory partitions on the memory device 10 may be utilized depending on the application and design of the overall system.

The memory device 10 may also include an interface 12. The interface 12 when in operation provides one or more signals to and/or receives one or more signals from an external device, such as a processor or controller (e.g., a system on a chip 14 (SoC), which may be a memory controller) external to the memory device 10. These signals may include, for example, clock signals, command signals, status signals, data signals, etc. In some embodiments, a bus 16 (or a signal path or another group of signal paths) may, individually or in combination, allow for single direction and/or bidirectional transmission of signals between the SoC 14 and the memory device 10. In this manner, the SoC 14 may provide various signals to the memory device 10 to facilitate the transmission and receipt of data to be written to or read from the memory device 10 and, for example, can receive signals related to the operation of, at least, portions of the memory device 10.

As will be appreciated, the interface 12 may include a number of circuits, such as a clock input circuit 18 (e.g., to handle received clock signals), as well as command input circuits (e.g., to handle received commands and/or addresses), data input circuits (e.g., to handle received data signals). In this manner, the interface ensures proper handling of the received signals as well as, for example, transmission of any signals (e.g., status signals and/or operating condition signals of the memory device, output data signals from the memory device, etc.)

As illustrated, the interface 12 may receive one or more clock signals from an external device, such as the SoC 14 (e.g., a processor, controller, for example, a memory controller, a register clock driver (RCD) for a dual inline memory module, or the like) along signal path 20 of the bus 16. Likewise, the interface 12 can receive commands (e.g., a read command, write command, etc.), which may be entered on the positive edges of a clock signal as well as data transmitted along signal path 22 of the bus 16, which may be transmitted and/or received on both positive and negative clock edges. In some embodiments, commands can be of a variable clock length (e.g., one or more clocks are used to receive the commands).

In addition, the interface 12, when in operation, may also receive a number of other command signals. For instance, a reset command may be used to reset the interface 12, status registers, state machines and the like during power-up. Various signals to facilitate testing of the memory device 10 may be provided as well. For instance, the testing signals may be used to place the memory device 10 into a test mode for connectivity testing or other testing, the results of which can be transmitted, for example, along signal path 23 of the bus 16. The interface 12 may also be used to provide an alert signal or another alarm signal to the SoC 14 for certain errors that may be detected.

As previously discussed, the interface 12 may receive one or more clock signals. In some embodiments, the received clock signal(s) along signal path 20 may be provided to the clock input circuit 18. In some embodiments, the clock input circuit 18, when in operation, transmits an internal clock signal CLK therefrom (e.g., based upon the received one or more clock signals). Additionally, as will be discussed in greater detail below, the clock input circuit 18 may also operate to test operation of aspects of the memory device 10 (e.g., how PVT impacts the internal clock generated by the clock input circuit 18 and, accordingly, synchronization of the internal clock with received data). The results of this testing may be transmitted from the clock input circuit 18 along signal path 23 to the SoC 14, which, as will be discussed in greater detail below, can utilize the results to alter the clock signal transmitted to the memory device 10 to insure accurate synchronization with data transmitted to the memory device 10.

In some embodiments, the internal clock signal that is generated by the clock input circuit 18 is supplied to clock adjustment circuitry 24 (e.g., an internal oscillator, such as a ring oscillator), which may be and/or may include, for example, a clock tree that operates to reduce skew and delay. The clock adjustment circuitry 24 can transmit a clock therefrom to, for example, data latches 26, which may operate to utilize the received clock signal in conjunction with the received data signals (transmitted to the memory device 10 along signal path 22) to initiate and/or execute memory operations (e.g., read and/or write operations) in the memory cells of the memory device 10. More specifically, the data (i.e., the data present in the data signals) may be sent to or retrieved from the memory partitions utilizing, for example, data latches 26. This data can be sent to and from the memory device 10 utilizing command and clocking signals discussed above, and by transmitting and receiving the data signals through, for example, an input/output (I/O) interface of the memory device 10.

As will be appreciated, various other components such as power supply circuits (for receiving external VDD and VSS signals), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. This host device can include the SoC 14 and, in some embodiments, the host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. It should be noted that the above terms used to describe these various examples of systems, like many of the other terms used herein, may share some referents and, as such, should not be construed narrowly in virtue of the other items listed.

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

The memory device 10 may benefit from having clock signals that are synchronized with received data signals. This allows for memory operations to be performed more accurately. However, as will be discussed in greater detail herein, the internal clock signal may be altered by, for example PVT and/or other influences that cause error (e.g., drift) in the internal clock signal. This can lead to desynchronization with received data and, accordingly, reduced efficiency in memory operations.

One portion of the memory device 10 that can be affected by PVT and/or other influences (e.g., conditions) is the clock adjustment circuitry 24. To assist in offsetting conditions that would otherwise alter aspects of the clock signal issuing from the clock adjustment circuitry 24 (e.g., alteration to the expected amount of propagation delay introduced by the clock adjustment circuitry 24 due to the aforementioned conditions), in some embodiments, the clock input circuit 18 may include, for example a testing circuit 30 that includes a clock adjustment circuitry replica 32 (e.g., an internal oscillator, such as a ring oscillator), a counter 34, and a register 36. These elements of the testing circuit 30 in the clock input circuit 18 when in operation can, for example, be utilized in the generation of one or measurements indicative of the operation of the clock adjustment circuitry 24, the storage of the one or more measurements, and the transmission thereof to, for example, the SoC 14.

Figure 2:
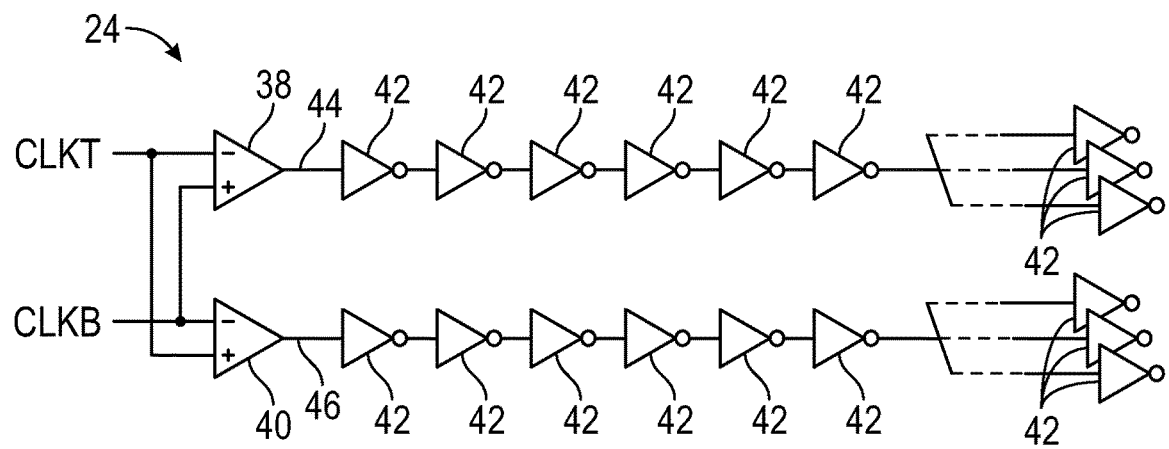
FIG. 2 is a schematic diagram of an embodiment of the clock adjustment circuitry of the memory device of FIG. 1, according to an embodiment of the present disclosure.

FIG. 2 illustrates an example of the clock adjustment circuitry 24. As illustrated, the clock adjustment circuitry 24 is a clock tree that includes differential amplifier circuit 38 and differential amplifier circuit 40 as well as a series of inverters 42 coupled to each of the differential amplifier circuit 38 and differential amplifier circuit 40. As illustrated, differential amplifier circuit 38 receives a true (e.g., non-inverted) clock signal at its negative input while differential amplifier circuit 38 receives a compliment (e.g., inverted) clock signal at its positive input. In contrast, differential amplifier circuit 40 receives the true clock signal at its positive input while differential amplifier circuit 40 receives the compliment clock signal at its negative input. The outputs of differential amplifier circuits 38 and 40 are respectively transmitted along wiring path 44 and wiring path 46.

Additionally, as illustrated, the inverters 42 are disposed on each of wiring path 44 and wiring path 46. While six inverters 42 are illustrated along each wiring path 44 and wiring path 46 (prior to the wiring paths 44 and 46 splitting into local transmission lines), it should be noted that "n" inverters 42 (whereby "n" is a positive integer number) may be employed to generate an output clock (e.g., a delayed internal clock signal) having a predetermined amount of delay. In this manner, "n" may be selected to generate a delayed clock having a predetermined amount of delay that is determined to properly synchronize with data signals to perform data operations. However, this internal propagation delay introduced by the clock adjustment circuitry 24 be changed drastically by conditions affecting the memory device, for example, voltage or temperature drift, causing the data valid window to decrease. Moreover, it may be difficult to measure the condition dependency (e.g., the PVT effects) external to the memory device 10.

Accordingly, in some embodiments, to improve the memory device 10 operation accuracy, the SoC 14 can initiate a testing operation to measure internal delay added by conditions (e.g., PVT). This may be accomplished using, for example, the testing circuit 30 and, more specifically, the clock adjustment circuitry replica 32, the counter 34, and the register 36 of the testing circuit 30 previously discussed in conjunction with FIG. 1. As illustrated in FIG. 1, the SoC 14 can initiate a test by issuing a particular command, for example, a timing training command. This command can cause the clock adjustment circuitry replica 32 (e.g., a clock tree replica of the clock tree in the clock adjustment circuitry 24) to begin operation.

Figure 3:
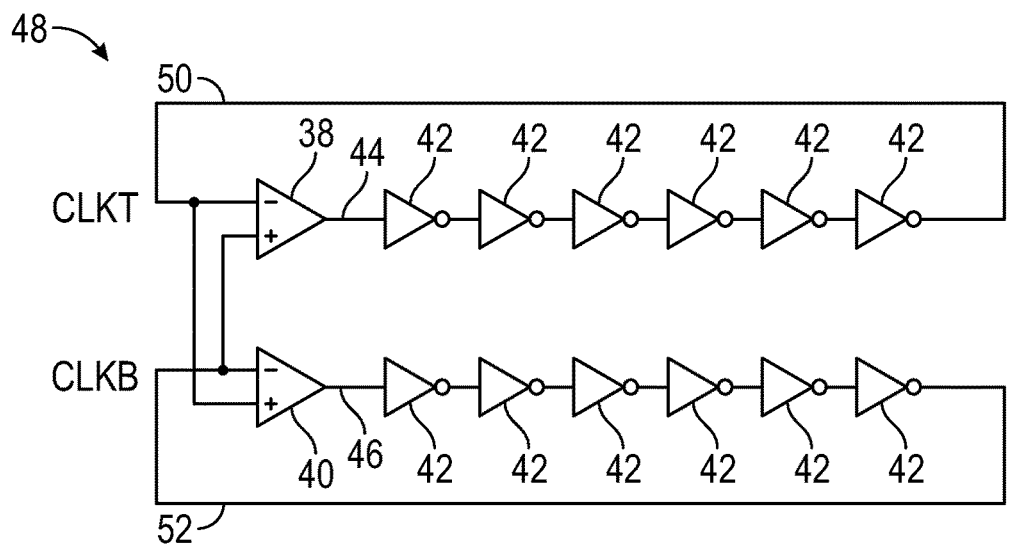
FIG. 3 is a schematic diagram of a first embodiment of the replica clock adjustment circuitry FIG. 1, according to an embodiment of the present disclosure.

FIG. 3 illustrates a first embodiment of the clock adjustment circuitry replica 32 of FIG. 1, referred to herein as the clock adjustment replica circuit 48 (e.g., an oscillator, such as a ring oscillator). As illustrated, the clock adjustment replica circuit 48 is a clock tree that includes differential amplifier circuit 38 and differential amplifier circuit 40 as well as a series of inverters 42 coupled to each of differential amplifier circuit 38 and differential amplifier circuit 40. As illustrated, differential amplifier circuit 38 receives a true (e.g., non-inverted) clock signal at its negative input while differential amplifier circuit 38 receives a compliment (e.g., inverted) clock signal at its positive input. In contrast, differential amplifier circuit 40 receives the true clock signal at its positive input while differential amplifier circuit 40 receives the compliment clock signal at its negative input. The outputs of differential amplifier circuits 38 and 40 are respectively transmitted along wiring path 44 and wiring path 46.

Additionally, as illustrated, the inverters 42 are disposed on each of wiring path 44 and wiring path 46. While six inverters 42 are illustrated along each wiring path 44 and wiring path 46 (prior to the wiring paths 44 and 46 splitting into local transmission lines), it should be noted that "n" inverters 42 (whereby "n" is a positive integer number) may be employed to generate an output clock (e.g., a delayed internal clock signal) having a predetermined amount of delay. It should also be noted that "n" may be selected to match the selected value for "n" in the clock adjustment circuitry 24. In this manner, the clock adjustment replica circuit 48 is designed such that an output clock period is set to be equal to delay amount of the clock tree of the clock adjustment circuitry 24. That is, for example, the oscillation cycle of the clock adjustment replica circuit 48 is designed to match the timing of the propagation delay of the clock adjustment circuitry 24. Additionally, it should be noted that the clock adjustment replica circuit 48 includes a feedback path 50 coupled to an output of the last inverter 42 on wiring path 44 and that the feedback path 50 is also coupled to the negative input of the differential amplifier circuit 38. Similarly, the clock adjustment replica circuit 48 includes a feedback path 52 coupled to an output of the last inverter 42 on wiring path 46 and that the feedback path 52 is also coupled to the negative input of the differential amplifier circuit 40.

In some embodiments, one or more of the outputs of the of the last inverter 42 on wiring path 44 and/or the of the last inverter 42 on wiring path 46 can additionally be coupled to the counter 34 of the of the clock input circuit 18 previously discussed in conjunction with FIG. 1. Returning to FIG. 1, the counter 34 may operate to count (i.e., determine) the amount of delay time that is experienced by the clock adjustment replica circuit 48 (i.e., along one or both of wiring path 44 and wiring path 46). For example, the counter 34 counts the clock adjustment replica circuit 48 oscillation cycle and this measured time should correspond to the propagation delay of the clock adjustment circuitry 24 when in operation. Thus, any delays affecting the propagation delay of the clock adjustment circuitry 24 (e.g., PVT influences causing additional delay) should also be reflected in the total time of the measured oscillation cycle of the clock adjustment replica circuit 48. The result of this count (e.g., an indication of the time for the oscillator cycle of the clock adjustment replica circuit 48) may be stored, for example, in register 36 (or another storage element). The stored value in register 36 may represent the total delay present in the clock adjustment circuitry replica 32 and, thus, corresponds to the total delay present in the clock adjustment circuitry 24 (i.e., the actual propagation delay of the clock adjustment circuitry 24).

Since the clock adjustment circuitry replica 32 can be a replica of the clock adjustment circuitry 24, the condition dependency (e.g., the PVT effects) affecting the clock adjustment circuitry 24 similarly affect the clock adjustment circuitry replica 32. Thus any additional delay generated in the clock adjustment circuitry replica 32 mirrors (e.g., replicates) additional delay being imposed on the clock adjustment circuitry 24 by conditions, such as PVT. An indication of this value (i.e., the total measured time of the operation of the clock adjustment circuitry replica 32 represented by a count of the counter 34) may be stored in the register 36 for transmission to the SoC 14, for example, along signal path 23 of the bus 16. The SoC 14 can receive this value transmitted from the register 36 (e.g., via a register read operation by the SoC 14, including, for example, a mode register read command) and the SoC 14 can adjust the clock/data timing based on the received value to insure proper synchronization of the data and clock signals. For example, the SoC 14, when it detects that the received value represents a delay that is shifted from a desired value, the SoC 14 in response can adjust DQ input timing to make a timing between the clock signal and the data match.

There exists a potential issue when utilizing the clock adjustment replica circuit 48 as the clock adjustment circuitry replica 32. For example, as illustrated in FIGS. 2 and 3, the clock adjustment circuitry 24 (and, accordingly, the clock adjustment replica circuit 48) utilizes differential amplifier circuits 38 and 40 in conjunction with the clock inputs (i.e., the true clock signal and the compliment clock signal). The input swing value therebetween may be low (for example, approximately 200 mV) when the clock inputs have high frequency values. However, in the case of the clock adjustment replica circuit 48 as the clock adjustment circuitry replica 32, the differential amplifier circuits 38 and 40 clock inputs correspond to a full rail to rail swing (approximately, for example 1.05V). This may be due to, for example, the feedback paths 50 and 52 being tied to a rail to rail circuit (i.e., the series of inverters 42), leading to a voltage domain corresponding to a rail to rail swing. This difference in the input swing between the clock adjustment replica circuit 48 as the clock adjustment circuitry replica 32 and the clock adjustment circuitry 24 can cause a timing mismatch between the clock adjustment circuitry 24 and the clock adjustment circuitry replica 32. Accordingly, this can result in a delay value stored in register 36 that does not fully correspond to the delay in the clock adjustment circuitry 24, resulting in the SoC 14 being unable to properly account for effects on the clock adjustment circuitry 24 when implementing testing operation to measure internal delay added by conditions (e.g., PVT) and to correct for those influences.

Thus, to overcome this potential issue causes by the swing differences in the inputs to the differential amplifier circuits 38 and 40 of the clock adjustment replica circuit 48 with respect to the differential amplifier circuits 38 and 40 of the clock adjustment circuitry 24, alternative circuitry may be utilized as the clock adjustment circuitry replica 32.

Figure 4:
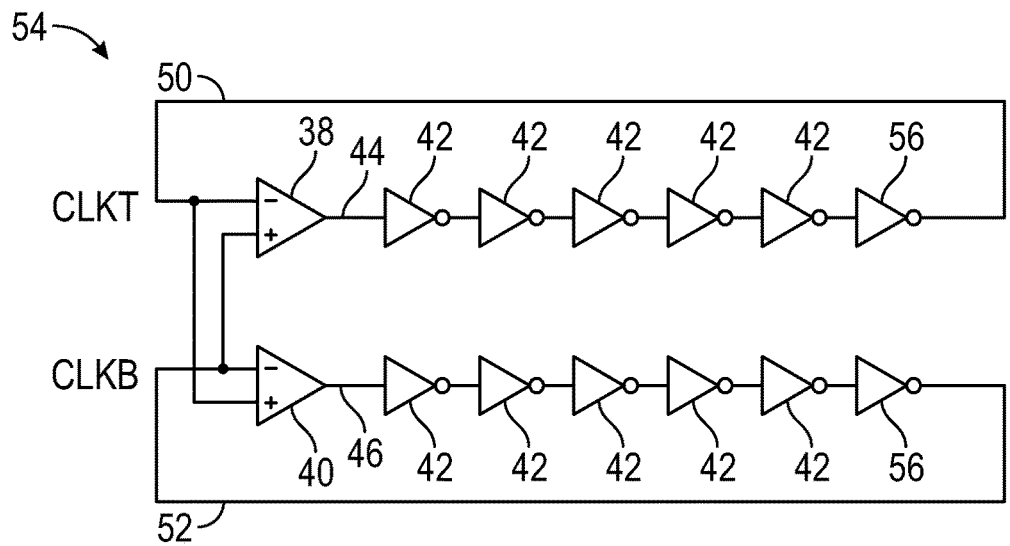
FIG. 4 is a schematic diagram of a second embodiment of the replica clock adjustment circuitry FIG. 1, according to an embodiment of the present disclosure.

FIG. 4 illustrates a second embodiment of the clock adjustment circuitry replica 32 of FIG. 1, referred to herein as the clock adjustment replica circuit 54 (e.g., an oscillator, such as a ring oscillator). As illustrated, the clock adjustment replica circuit 54 is a clock tree that includes differential amplifier circuit 38 and differential amplifier circuit 40, a respective series of inverters 42 coupled thereto, as well as a swing oscillator driver 56 at the end of each series of inverters 42 along each of wiring path 44 and wiring path 46. As illustrated, differential amplifier circuit 38 receives a true (e.g., non-inverted) clock signal at its negative input while differential amplifier circuit 38 receives a compliment (e.g., inverted) clock signal at its positive input. In contrast, differential amplifier circuit 40 receives the true clock signal at its positive input while differential amplifier circuit 40 receives the compliment clock signal at its negative input. The outputs of differential amplifier circuits 38 and 40 are respectively transmitted along wiring path 44 and wiring path 46.

Additionally, as illustrated, the inverters 42 are disposed on each of wiring path 44 and wiring path 46. As noted above, five inverters 42 and a swing oscillator driver 56 are illustrated along each wiring path 44 and wiring path 46 (prior to the wiring paths 44 and 46 splitting into local transmission lines), it should be noted that "n−1" inverters 42 and swing oscillator driver 56 (whereby "n" is a positive integer number) may be employed to generate an output clock (e.g., a delayed internal clock signal) having a predetermined amount of delay. It should also be noted that "n" may be selected to match the selected value for "n" in the clock adjustment circuitry 24. In this manner, the clock adjustment replica circuit 54 is designed such that an output clock period is set to be equal to delay amount of the clock tree of the clock adjustment circuitry 24. That is, for example, the oscillation cycle of the clock adjustment replica circuit 54 is designed to match the timing of the propagation delay of the clock adjustment circuitry 24. Additionally, it should be noted that the clock adjustment replica circuit 54 includes a feedback path 50 coupled to an output of the last inverter 42 on wiring path 44 and that the feedback path 50 is also coupled to the negative input of the differential amplifier circuit 38. Similarly, the clock adjustment replica circuit 54 includes a feedback path 52 coupled to an output of the last inverter 42 on wiring path 46 and that the feedback path 52 is also coupled to the negative input of the differential amplifier circuit 40.

In some embodiments, one or more of the outputs of the of the swing oscillator driver 56 on wiring path 44 and/or the of the swing oscillator driver 56 on wiring path 46 can additionally be coupled to the counter 34 of the of the clock input circuit 18 previously discussed in conjunction with FIG. 1. Returning to FIG. 1, the counter 34 may operate to count (i.e., determine) the amount of delay time that is experienced by the clock adjustment replica circuit 54 (i.e., along one or both of wiring path 44 and wiring path 46). For example, the counter 34 counts the clock adjustment replica circuit 54 oscillation cycle and this measured time should correspond to the propagation delay of the clock adjustment circuitry 24 when in operation. Thus, any delays affecting the propagation delay of the clock adjustment circuitry 24 (e.g., PVT influences causing additional delay) should also be reflected in the total time of the measured oscillation cycle of the clock adjustment replica circuit 54. The result of this count (e.g., an indication of the time for the oscillator cycle of the clock adjustment replica circuit 54) may be stored, for example, in register 36 (or another storage element). The stored value in register 36 may represent the total delay present in the clock adjustment circuitry replica 32 and, thus, corresponds to the total delay present in the clock adjustment circuitry 24 (i.e., the actual propagation delay of the clock adjustment circuitry 24).

Since the clock adjustment circuitry replica 32 can be a replica of the clock adjustment circuitry 24, the condition dependency (e.g., the PVT effects) affecting the clock adjustment circuitry 24 similarly affect the clock adjustment circuitry replica 32. Thus any additional delay generated in the clock adjustment circuitry replica 32 mirrors (e.g., replicates) additional delay being imposed on the clock adjustment circuitry 24 by conditions, such as PVT. An indication of this value (i.e., the total measured time of the operation of the clock adjustment circuitry replica 32 represented by a count of the counter 34) may be stored in the register 36 for transmission to the SoC 14, for example, along signal path 23 of the bus 16. The SoC 14 can receive this value transmitted from the register 36 (e.g., via a register read operation by the SoC 14, including, for example, a mode register read command) and the SoC 14 can adjust the clock/data timing based on the received value to insure proper synchronization of the data and clock signals. For example, the SoC 14, when it detects that the received value represents a delay that is shifted from a desired value, the SoC 14 in response can adjust DQ input timing to make a timing between the clock signal and the data match.

Modifying the final stage of the oscillator using the swing oscillator drivers 56 as illustrated in FIG. 4 may overcome the above discussed issue of swing mismatch with respect to the clock adjustment replica circuit 48 that can occur when the memory device 10 utilizes clock signals having particular (e.g., high) frequencies. This may be because the swing oscillator drivers 56 of the clock adjustment replica circuit 54 allow for generation of a swing that corresponds to the swing input to the differential amplifier circuits 38 and 40 of the clock adjustment circuitry 24, based upon the signals transmitted along feedback paths 50 and 52. That is, because of the swing alignment between the clock adjustment circuitry 24 and the clock adjustment replica circuit 54, potential timing mismatch between the propagation delay of the clock adjustment circuitry 24 and the clock adjustment circuitry replica 32 (as the clock adjustment replica circuit 54) is alleviated. Accordingly, this can result in a delay value being stored in register 36 that more accurately corresponds to the delay in the clock adjustment circuitry 24, resulting in the SoC 14 being able to properly account for effects on the clock adjustment circuitry 24 when implementing testing operation to measure internal delay added by conditions (e.g., PVT) and to correct for those influences.

Figure 5:
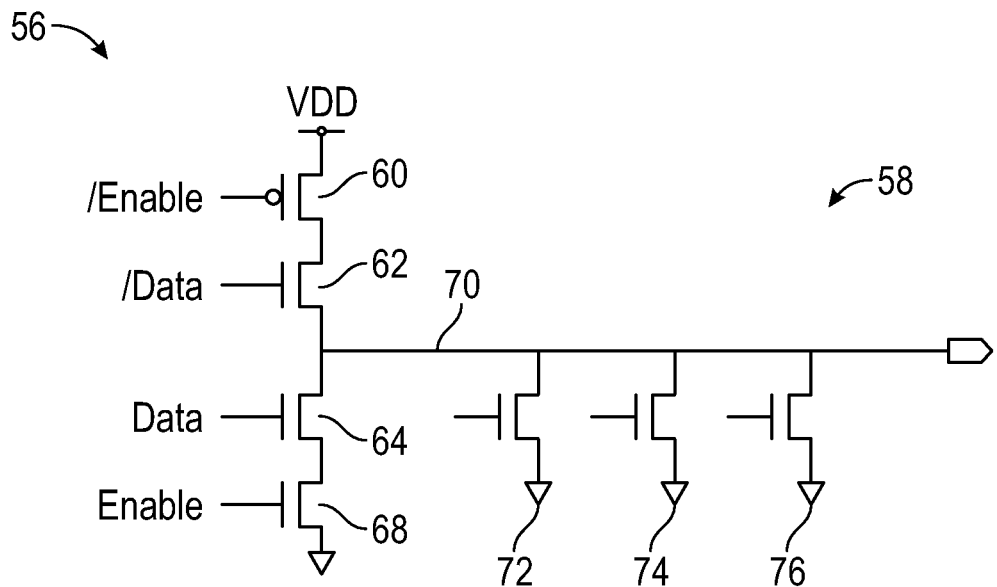
FIG. 5 is a schematic diagram of an embodiment of swing oscillator driver of the second embodiment of the replica clock adjustment circuitry of FIG. 4, according to an embodiment of the present disclosure.

FIG. 5 illustrates an example of the swing oscillator driver 56 inclusive of a strength control circuit 58. As illustrated, the swing oscillator driver 56 includes transistor 60 (e.g., a PMOS transistor) that receives a complementary enable signal, transistor 62 (e.g., an NMOS transistor) that receives a complementary data signal, transistor 64 (e.g., an NMOS transistor) that receives a true enable signal, and transistor 68 (e.g., an NMOS transistor) that receives a true enable signal. In this manner, the transistor 60, transistor 62, transistor 64, transistor 68 differ from the inverters 42 by utilizing three NMOS transistors and one PMOS transistor in place of the two NMOS transistors and two PMOS transistors utilized in inverters 42. As further illustrated, an output signal is transmitted from transistor 62 along signal path 70.

This output signal is modified by the strength control circuit 58. The strength control circuit 58 includes transistor 72, transistor 74, and transistor 76 which can operate selectively (e.g., one or more of the transistor 72, transistor 74, and transistor 76 operating alone or in conjunction with one another) to, for example, adjust (e.g., pull down) the voltage of the signal along signal path 70. The control of the strength control circuit 58 can be altered based on the input signals to the gates of each of the transistor 72, transistor 74, and transistor 76. In some embodiments, the values at each of the gates of the transistor 72, transistor 74, and transistor 76 may be fixed and provided by, for example, a test mode signal (e.g., one or more values stored in an internal memory device 10 register). However, these gate values are controllable to selectively adjust the voltage of the signal on the signal path 70 to predetermined values.

In operation, the swing level is determined by the complimentary data input NMOS transistor (e.g., transistor 62) and the strength control circuit 58, more particularly, the transistor drivability of transistors 72, 74, and 76. The strength control circuit 58 operates to control the swing value by altering a voltage of the signal transmitted along signal path 70 (which can be coupled to one of feedback path 50 or 52), which results in lowered swing values at the inputs to the respective differential amplifier circuit 38 or 40. By utilizing a controllable strength control circuit 58 (i.e., where the values at each of the gates of the transistor 72, transistor 74, and transistor 76 are set to adjust the voltage of the signal on signal path 70 to correspond to, for example, swing levels introduced to the inputs of the differential amplifier circuits 38 and 40). The predetermined gate values of the transistors 72, 74, and 76 may be set, for example, based on the SoC 14 implemented. This allows for greater flexibility in using the memory device 10 having the strength control circuit 58 in conjunction with differing SoC 14 and/or host devices.

In some embodiments, one or more of the outputs of the of the swing oscillator driver 56 from signal path 70 can additionally be coupled to the counter 34 of the clock input circuit 18 previously discussed in conjunction with FIG. 1. Returning to FIG. 1, the counter 34 may operate to count (i.e., determine) the amount of delay time that is experienced by the clock adjustment replica circuit 54 (i.e., along one or both of wiring path 44 and wiring path 46). For example, the counter 34 counts the clock adjustment replica circuit 54 oscillation cycle and this measured time should correspond to the propagation delay of the clock adjustment circuitry 24 when in operation. Thus, any delays affecting the propagation delay of the clock adjustment circuitry 24 (e.g., PVT influences causing additional delay) should also be reflected in the total time of the measured oscillation cycle of the clock adjustment replica circuit 54. The result of this count (e.g., an indication of the time for the oscillator cycle of the clock adjustment replica circuit 54) may be stored, for example, in register 36 (or another storage element). The stored value in register 36 may represent the total delay present in the clock adjustment circuitry replica 32 and, thus, corresponds to the total delay present in the clock adjustment circuitry 24 (i.e., the actual propagation delay of the clock adjustment circuitry 24).

Since the clock adjustment circuitry replica 32 can be a replica of the clock adjustment circuitry 24, the condition dependency (e.g., the PVT effects) affecting the clock adjustment circuitry 24 similarly affect the clock adjustment circuitry replica 32. Thus any additional delay generated in the clock adjustment circuitry replica 32 mirrors (e.g., replicates) additional delay being imposed on the clock adjustment circuitry 24 by conditions, such as PVT. An indication of this value (i.e., the total measured time of the operation of the clock adjustment circuitry replica 32 represented by a count of the counter 34) may be stored in the register 36 for transmission to the SoC 14, for example, along signal path 23 of the bus 16. The SoC 14 can receive this value transmitted from the register 36 (e.g., via a register read operation by the SoC 14, including, for example, a mode register read command) and the SoC 14 can adjust the clock/data timing based on the received value to insure proper synchronization of the data and clock signals. For example, the SoC 14, when it detects that the received value represents a delay that is shifted from a desired value, the SoC 14 in response can adjust DQ input timing to make a timing between the clock signal and the data match.

Figure 6:
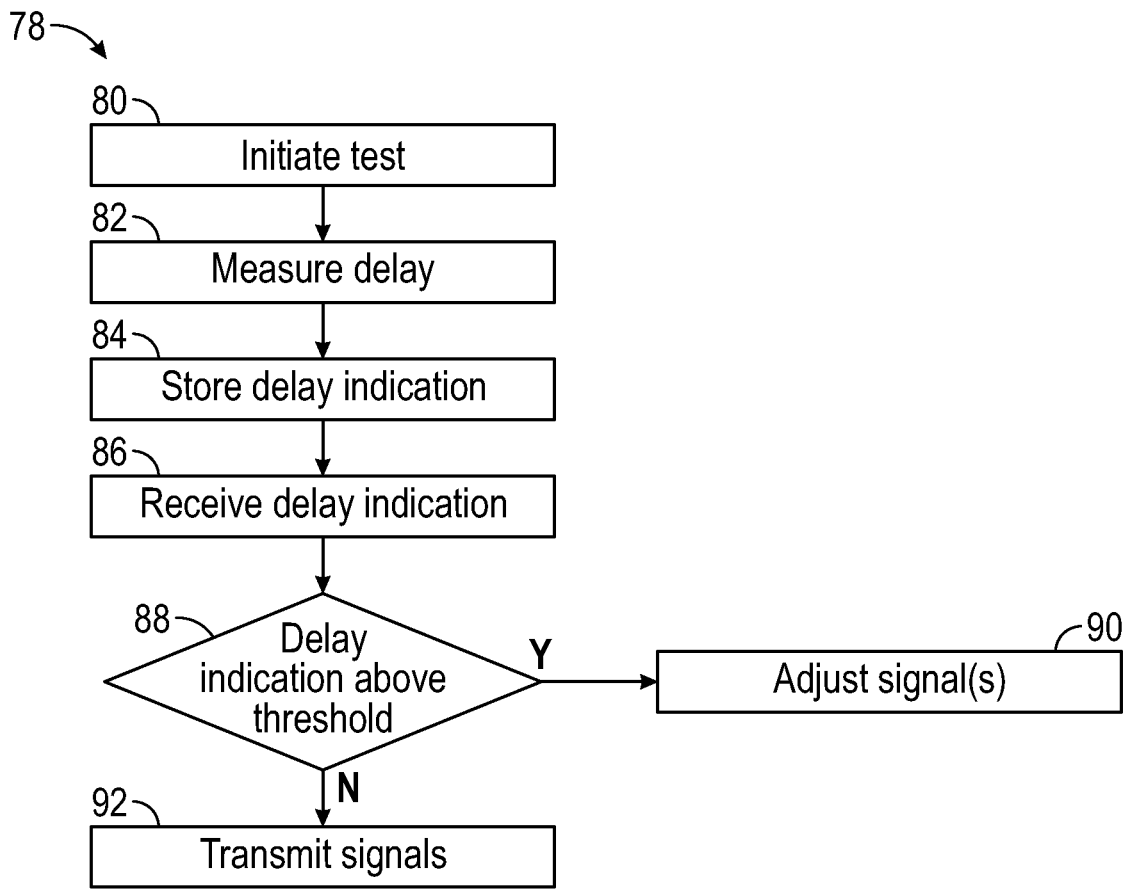
FIG. 6 illustrates a flow chart illustrating utilization of the second embodiment of the replica clock adjustment circuitry of FIG. 4, according to an embodiment of the present disclosure.

FIG. 6 illustrates an example of a method 78 to improve the operational accuracy of the memory device 10 operation accuracy utilizing, for example, the above described circuitry. More particularly, the method 78 include steps to allow for a testing operation to measure additional propagation delay of the clock adjustment circuitry 24 added by conditions (e.g., PVT). This method may be performed, for example, at startup of the memory device 10. In step 80, the test is initiated. Step 80 may include, for example, the SoC 14 initiating the test by issuing a particular command, for example, a timing training command. This command can cause the clock adjustment circuitry replica 32 (e.g., inclusive of the clock adjustment replica circuit 54) to begin operation. Additionally, in step 80 as part of the test operation, the clock adjustment circuitry replica 32, for example, inclusive of the clock adjustment replica circuit 54, begins an operation of transmission of signals through the clock adjustment replica circuit 54 to mimic clock signals transmitted through the clock adjustment circuitry 24. As discussed above, the clock adjustment replica circuit 54 can be designed such that an output clock period (i.e., oscillator cycle of the clock adjustment replica circuit 54) is set to be equal to delay amount of the clock tree of the clock adjustment circuitry 24. Additionally, by utilizing the swing oscillator driver 56, swing of the input signals to the clock adjustment replica circuit 54 can match the swing of the input signals to the clock adjustment circuitry 24.

In step 82, the output clock period of the clock adjustment replica circuit 54 (i.e., oscillator cycle of the clock adjustment replica circuit 54) is measured. This may be accomplished, for example, by counter 34 which operates to count (i.e., determine) the amount of delay time that is experienced by the clock adjustment replica circuit 54 (i.e., along one or both of wiring path 44 and wiring path 46). For example, the counter 34 counts the clock adjustment replica circuit 54 oscillation cycle. The counter, in step 84, outputs the determined value for the delay time for storage in, for example, register 36. In step 86, the SoC 14 receives the stored value indicative of the delay time that is experienced by the clock adjustment replica circuit 54. As part of step 86, receipt of this value may include the SoC 14 transmitting a command, for example, a mode register read command that causes transmission of the stored value to be provided via a register read and received by the SoC 14 across, for example, signal path 23 of the bus 16.

In step 88, the SoC 14 checks the received value against, for example, a threshold value (i.e., a predetermined or expected delay value). If the received value is determined to be above (greater than) the threshold value by the SoC 14, this is indicative of additional propagation delay (e.g., drift) in the internal clock signal caused by, for example, PVT influences. Accordingly, when this additional delay is determined, the SoC 14, in step 90 adjusts one or more signals (e.g., clock and/or data signals). This adjustment by the SoC 14 may include, for example, adjustment of DQ input timing signals to insure that the timing between the clock and the data signals match (i.e., are synchronized). The adjusted signals can be transmitted to the memory device in step 92 to perform memory operations in the memory device 10.

Likewise, if in step 88 the received value is determined to be below (less than) the threshold value (or, for example, less than or equal to the threshold value) by the SoC 14, this is indicative of no additional propagation delay in the internal clock signal. Accordingly, the SoC 14, in step 92 transmits one or more signals (e.g., clock and/or data signals) that are not adjusted to account for PVT or other conditions affecting the propagation delay of the clock adjustment circuitry 24.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
    a clock adjustment circuit comprising:
        a differential amplifier;
        an inverter coupled to a first output of the differential amplifier; and
        a swing oscillator driver coupled to a second output of the inverter and an input of the differential amplifier, wherein the swing oscillator driver comprises:
            a series of transistors;
            a signal path coupled to at least a first transistor of the series of transistors, wherein the signal path when in operation transmits a signal having a first voltage; and
            a strength control circuit coupled to the signal path, wherein the strength control circuit when in operation adjusts the first voltage of the signal to a second voltage.

2. The device of claim 1, comprising a feedback path coupled between the swing oscillator driver and the input of the differential amplifier.

3. The device of claim 2, wherein the feedback path when in operation transmits the signal having the second voltage to the input of the differential amplifier.

4. The device of claim 1, wherein the strength control circuit when in operation generates the second voltage of the signal to a first predetermined value.

5. The device of claim 4, wherein the strength control circuit when in operation generates the second voltage of the signal to a second predetermined value.

6. The device of claim 5, wherein the strength control circuit comprises a second transistor in parallel with a third transistor.

7. The device of claim 6, wherein the strength control circuit when in operation generates the second voltage of the signal to the first predetermined value based on a first control input received at a first gate of the second transistor and a second control input received at a second gate of the third transistor.

8. The device of claim 7, wherein the strength control circuit when in operation generates the second voltage of the signal to the second predetermined value based on a third control input received at the first gate of the second transistor and a fourth control input received at the second gate of the third transistor.

9. The device of claim 1, wherein the clock adjustment circuit comprises:
    a second differential amplifier;
    a second inverter coupled to a third output of the second differential amplifier; and a second swing oscillator driver coupled to a fourth output of the inverter and a second input of the second differential amplifier, wherein the second swing oscillator driver comprises:
a second series of transistors;
a second signal path coupled to at least a second transistor of the second series of transistors, wherein the second signal path when in operation transmits a second signal having a third voltage; and
a second strength control circuit coupled to the second signal path, wherein the second strength control circuit when in operation adjusts the third voltage of the second signal to a fourth voltage.

10. The device of claim 9, wherein the second strength control circuit when in operation generates the fourth voltage of the second signal to a first predetermined value.

11. The device of claim 10, wherein the second strength control circuit when in operation generates the fourth voltage of the second signal to a second predetermined value.

12. The device of claim 11, wherein the second strength control circuit when in operation generates the fourth voltage of the second signal to the first predetermined value based on a first control input received at a first gate of a second transistor of the second strength control circuit and a second control input received at a second gate of a third transistor of the second strength control circuit.

13. The device of claim 12, wherein the strength control circuit when in operation generates the fourth voltage of the second signal to the second predetermined value based on a third control input received at the first gate of the second transistor and a fourth control input received at the second gate of the third transistor.

14. A device, comprising:
a testing circuit comprising replica clock adjustment circuitry configured to replicate propagation of a clock signal by clock adjustment circuitry of the device within a first amount of time, wherein the replica clock adjustment circuitry comprises an oscillator, comprising:
a differential amplifier;
an inverter coupled to an output of the differential amplifier; and
a swing oscillator driver coupled to a second output of the inverter and an input of the differential amplifier, wherein the swing oscillator driver comprises:
a signal path that when in operation transmits a signal having a first voltage; and
a strength control circuit coupled to the signal path, wherein the strength control circuit when in operation adjusts the first voltage of the signal to a second voltage.

15. The device of claim 14, wherein the testing circuit comprises a counter coupled to the signal path, wherein the counter when in operation determines an oscillation cycle of the swing oscillator driver based upon a count of the counter.

16. The device of claim 15, wherein the testing circuit comprises a register coupled to the counter.

17. The device of claim 16, wherein the counter transmits the count to the register to be stored as an indication of a time corresponding to the oscillation cycle of the swing oscillator driver.

* * * * *